United States Patent
Song

(10) Patent No.: US 12,007,834 B2
(45) Date of Patent: *Jun. 11, 2024

(54) SEMICONDUCTOR DEVICE

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/695,150

(22) Filed: Mar. 15, 2022

(65) Prior Publication Data

US 2023/0153194 A1 May 18, 2023

(30) Foreign Application Priority Data

Nov. 17, 2021 (KR) .......................... 10-2021-0158952

(51) Int. Cl.
| | |
|---|---|
| *G06F 11/10* | (2006.01) |
| *G06F 11/08* | (2006.01) |
| *G11C 8/06* | (2006.01) |
| *H03M 13/00* | (2006.01) |

(52) U.S. Cl.
CPC ................. *G06F 11/08* (2013.01); *G11C 8/06* (2013.01)

(58) Field of Classification Search
CPC .................................. G06F 11/08; G11C 8/06
See application file for complete search history.

(56) References Cited

U.S. PATENT DOCUMENTS

| | | | |
|---|---|---|---|
| 6,560,725 B1 | 5/2003 | Longwell et al. | |
| 7,143,329 B1 | 11/2006 | Trimberger et al. | |
| 7,797,610 B1 | 9/2010 | Simkins | |
| 8,588,017 B2 | 11/2013 | Park et al. | |
| 10,613,928 B2 * | 4/2020 | Kim | G06F 11/104 |
| 10,817,371 B2 | 10/2020 | Rooney et al. | |
| 10,922,170 B2 | 2/2021 | Kim et al. | |
| 11,249,843 B2 * | 2/2022 | Song | G11C 29/42 |
| 11,797,215 B2 * | 10/2023 | Choi | G06F 3/0619 |
| 2002/0051397 A1 | 5/2002 | Watanabe et al. | |
| 2003/0191888 A1 | 10/2003 | Klein | |
| 2004/0243886 A1 | 12/2004 | Klein | |
| 2006/0117155 A1 | 6/2006 | Ware et al. | |
| 2006/0285412 A1 | 12/2006 | Hummler | |
| 2007/0011513 A1 | 1/2007 | Biswas et al. | |
| 2007/0038919 A1 | 2/2007 | Sekiguchi et al. | |

(Continued)

FOREIGN PATENT DOCUMENTS

| | | |
|---|---|---|
| KR | 100667784 B1 | 1/2007 |
| KR | 1020170056823 A | 5/2017 |

(Continued)

*Primary Examiner* — Samir W Rizk
(74) *Attorney, Agent, or Firm* — WILLIAM PARK & ASSOCIATES LTD.

(57) ABSTRACT

A semiconductor device includes an error check execution signal generation circuit configured to generate an error check execution signal for performing an error check operation when an ECS (Error Check and Scrub) command that is generated based on a refresh command is input; and an ECS control circuit configured to generate an ECS active command and an ECS read command for performing the error check operation based on the ECS command and the error check execution signal, and successively generate the ECS read commands to perform the error check operation.

20 Claims, 14 Drawing Sheets

(56) References Cited

U.S. PATENT DOCUMENTS

| | | |
|---|---|---|
| 2008/0092016 A1 | 4/2008 | Pawlowski |
| 2008/0109705 A1 | 5/2008 | Pawlowski et al. |
| 2008/0148108 A1 | 6/2008 | Barnum et al. |
| 2010/0332943 A1 | 12/2010 | Abreu et al. |
| 2011/0126073 A1 | 5/2011 | Nieuwland et al. |
| 2012/0317352 A1 | 12/2012 | Kang et al. |
| 2014/0068319 A1 | 3/2014 | Daly |
| 2014/0211579 A1 | 7/2014 | Lovelace |
| 2014/0304566 A1* | 10/2014 | Henderson ............ G06F 1/3275 |
| | | 714/764 |
| 2016/0026533 A1 | 1/2016 | Ishikawa |
| 2017/0060681 A1* | 3/2017 | Halbert ................... G06F 3/064 |
| 2017/0139641 A1 | 5/2017 | Cha et al. |
| 2017/0161143 A1 | 6/2017 | Reed et al. |
| 2017/0221546 A1 | 8/2017 | Loh et al. |
| 2018/0046580 A1 | 2/2018 | Clark |
| 2018/0150350 A1* | 5/2018 | Cha ..................... G06F 11/1016 |
| 2019/0073261 A1* | 3/2019 | Halbert ................ G06F 3/0679 |
| 2019/0161341 A1* | 5/2019 | Howe ................ B81C 1/00301 |
| 2019/0179560 A1 | 6/2019 | Moon et al. |
| 2020/0034228 A1* | 1/2020 | Pawlowski ......... G06F 11/1004 |
| 2021/0141687 A1* | 5/2021 | Song .................... G06F 3/0659 |
| 2022/0148645 A1 | 5/2022 | Meier et al. |
| 2023/0083193 A1 | 3/2023 | Zhou et al. |

FOREIGN PATENT DOCUMENTS

| | | |
|---|---|---|
| KR | 1020170130788 A | 11/2017 |
| KR | 1020190063123 A | 6/2019 |
| KR | 1020210070138 A | 6/2021 |

* cited by examiner

SEMICONDUCTOR DEVICE

CROSS-REFERENCES TO RELATED APPLICATIONS

The present application claims priority under 35 U.S.C. § 119(a) to Korean application number 10-2021-0158952, filed in the Korean Intellectual Property Office on Nov. 17, 2021, the entire disclosure of which is incorporated herein by reference in its entirety.

BACKGROUND

The present disclosure relates to a semiconductor device capable of correcting an error of a codeword that is stored in a memory cell.

Recently, in order to increase the operation speed of a semiconductor device, a method for inputting/outputting multi-bit data in each clock cycle is used. Examples of the method include DDR2, DDR3, DDR4, and DDR5 methods. When the input/output speed of data is increased, the probability that an error will occur while the data are transmitted is also increased. Therefore, a separate device and method for guaranteeing the reliability of data transmission are additionally required.

According to a method for guaranteeing the reliability of data transmission, an error check code that makes it possible to check whether an error has occurred may be generated and transmitted with data, whenever the data is transmitted. Examples of the error check code may include an error detection code (EDC) capable of detecting an occurrence of error, and an error correction code (ECC) capable of correcting an error when the error has occurred.

SUMMARY

In an embodiment, a semiconductor device may include: an error check execution signal generation circuit configured to generate an error check execution signal for performing an error check operation when an ECS (Error Check and Scrub) command that is generated based on a refresh command is input; and an ECS control circuit configured to generate an ECS active command and an ECS read command for performing the error check operation based on the ECS command and the error check execution signal, and successively generate the ECS read commands to perform the error check operation.

In another embodiment, a semiconductor device may include: an ECS control circuit configured to generate an ECS active command for performing an error check operation based on an ECS command and an error check execution signal, and then successively generate ECS read commands; and a select address generation circuit configured to output, during the error check operation, as a select row address and a select column address, a row address and a column address that are sequentially counted whenever the ECS active command and the ECS read command are input, and store the counted row address and column address when an error flag signal is input.

DETAILED DESCRIPTION

Figure 1:
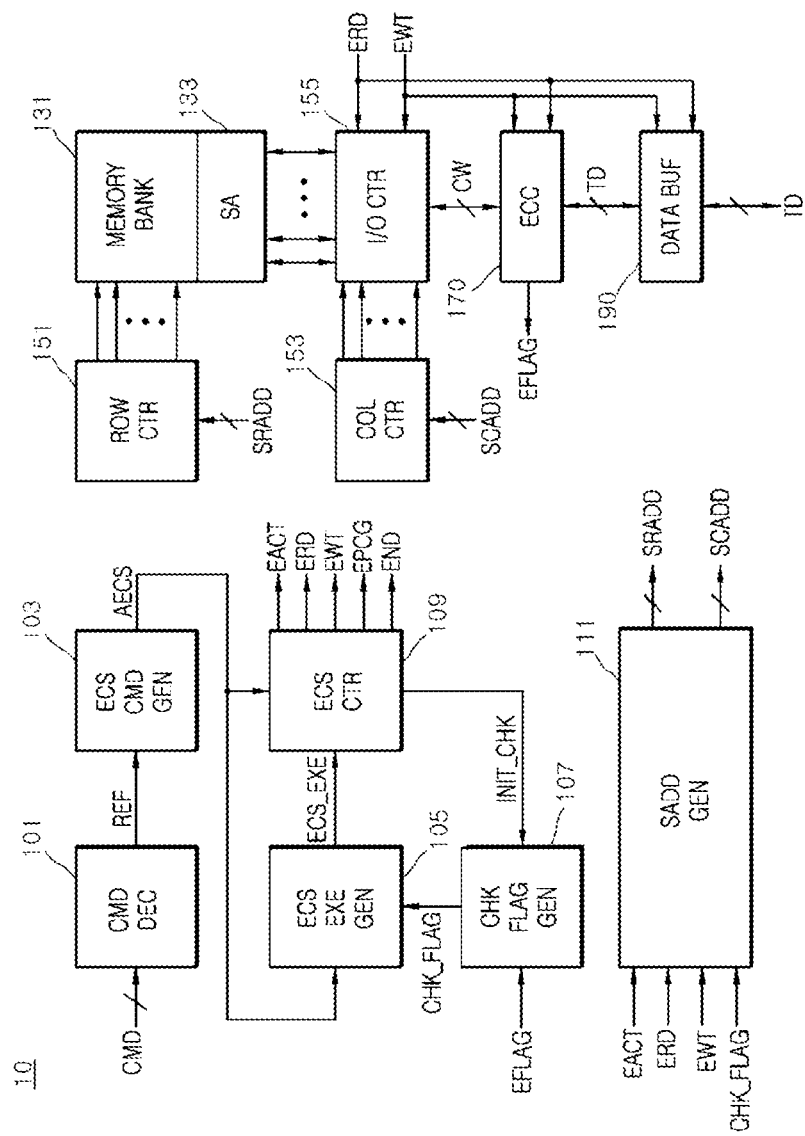
FIG. 1 is a block diagram illustrating a configuration of a memory device in accordance with an embodiment.

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second", which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed there between.

"Logic high level" and "logic low level" are used to describe the logic levels of signals. A signal with "logic high level" is distinguished from a signal with "logic low level." For example, when a signal with a first voltage corresponds to a signal with a "logic high level," a signal with a second voltage may correspond to a signal with a "logic low level." According to an embodiment, a "logic high level" may be set to a voltage higher than a "logic low level." According to an embodiment, the logic levels of signals may be set to different logic levels or opposite logic levels. For example, a signal with a logic high level may be set to have a logic low level according to an embodiment, and a signal with a logic low level may be set to have a logic high level according to an embodiment.

Hereafter, the teachings of the present disclosure will be described in more detail through embodiments. The embodiments are only used to exemplify the teachings of the present disclosure, and the scope of the present disclosure is not limited by the embodiments.

Some embodiments of the present disclosure are directed to a semiconductor device that performs an operation of correcting errors of codewords that are stored in memory cells, and storing the error-corrected codewords in the memory cells.

In accordance with some embodiments, the semiconductor device may perform the ECS operation that performs an error check operation of detecting errors of codewords that are stored in memory cells, correcting the errors of the codewords, and re-storing the codewords. Thus, the semiconductor device may perform the ECS operation that is capable of correcting the errors of the codewords that are stored in the memory cells, and re-storing the error-corrected codewords in the memory cells.

Furthermore, in accordance with some embodiments, the semiconductor device may perform the error check operation of detecting errors of the codewords that are stored in the memory cells, and then may perform the ECS operation only on an area in which the codeword that contains an error is stored, thereby reducing power consumption.

FIG. 1 is a block diagram illustrating a configuration of a semiconductor device 10 in accordance with an embodiment. The semiconductor device 10 may include a command decoder 101, an ECS (Error Check and Scrub) command generation circuit 103, an error check execution signal generation circuit 105, a check flag signal generation circuit 107, an ECS control circuit 109, a select address generation circuit 111, a memory bank 131, a sensing amplification circuit 133, a row control circuit 151, a column control circuit 153, an input/output control circuit 155, an error correction circuit 170, and a data buffer 190.

The command decoder 101 may generate a refresh command REF by decoding a command CMD. The command decoder 101 may generate the refresh command REF to perform a refresh operation. The command CMD may include a plurality of bits with a logic level combination for generating the refresh command REF.

The ECS command generation circuit 103 may generate an ECS command AECS based on the refresh command REF. The ECS command generation circuit 103 may generate the ECS command AECS whenever the refresh command REF is generated a preset number of times. For example, the ECS command generation circuit 103 may generate the ECS command AECS whenever the refresh command REF is generated K times. Here, K may be set to a natural number.

The error check execution signal generation circuit 105 may generate an error check execution signal ECS_EXE based on the ECS command AECS and a check flag signal CHK_FLAG. The error check execution signal generation circuit 105 may generate an error check execution signal ECS_EXE that is disabled during an initialization operation. The error check execution signal generation circuit 105 may generate the error check execution signal ECS_EXE that is enabled when the ECS command AECS is input thereto and the check flag signal CHK_FLAG is input thereto. The initialization operation may be set to a reset operation and a power-up period in which the semiconductor device 10 starts an operation.

The check flag signal generation circuit 107 may generate the check flag signal CHK_FLAG based on an error flag signal EFLAG and an initialization check signal INIT_CHK. The check flag signal generation circuit 107 may generate the check flag signal CHK_FLAG that is enabled when the error flag signal EFLAG is input thereto. The check flag signal generation circuit 107 may generate the check flag signal CHK_FLAG that is disabled when the initialization check signal INIT_CHK is input.

The ECS control circuit 109 may generate the initialization check signal INIT_CHK, an ECS active command EACT, an ECS read command ERD, an ECS write command EWT, an ECS precharge command EPCG, and an end signal END based on the ECS command AECS and the error check execution signal ECS_EXE. The ECS control circuit 109 may generate the initialization check signal INIT_CHK to disable the check flag signal CHK_FLAG. The ECS control circuit 109 may generate the ECS active command EACT for an ECS active operation. The ECS control circuit 109 may generate the ECS read command ERD for an error check operation and an ECS read operation. The ECS control circuit 109 may generate the ECS write command EWT for an ECS write operation. The ECS control circuit 109 may generate the ECS precharge command EPCG for a precharge operation of memory cells on which the error check operation and the ECS operation have been performed. The ECS control circuit 109 may generate the end signal END to end the error check operation and the ECS operation.

The ECS control circuit 109 may generate the initialization check signal INIT_CHK to disable the check flag signal CHK_FLAG. The ECS control circuit 109 may generate the initialization check signal INIT_CHK to disable the check flag signal CHK_FLAG after the ECS active command EACT, the ECS read command ERD, the ECS write command EWT, and the ECS precharge command EPCG are repeatedly generated a preset number of times.

The ECS control circuit 109 may generate the ECS active command EACT and thereafter repeatedly generate the ECS read command ERD to output the codewords CW that are stored in the memory cells, during a period in which the error check execution signal ECS_EXE is disabled. The ECS control circuit 109 may repeatedly generate the ECS read command ERD after generating the ECS active command EACT to determine whether each of the codewords CW that are stored in memory cells contains an error, during a period in which the error check execution signal ECS_EXE is disabled. During a period in which the error check execution signal ECS_EXE is enabled, the ECS control circuit 109 may sequentially generate the ECS active command EACT, the ECS read command ERD, the ECS write command EWT, the ECS precharge command EPCG, and the end signal END such that the ECS operation is performed on the memory cells in which the codewords CW that contain an error are stored.

The select address generation circuit 111 may generate a select column address SCADD and a select row address SRADD based on the ECS active command EACT, the ECS read command ERD, the ECS write command EWT, and the check flag signal CHK_FLAG. Whenever the ECS active command EACT and the ECS read command ERD are generated, the select address generation circuit 111 may sequentially generate the select column address SCADD and the select row address SRADD to access memory cells on which the ECS operation is performed. Whenever the ECS active command EACT and the ECS write command EWT are generated, the select address generation circuit 111 may sequentially generate the select column address SCADD and the select row address SRADD to access memory cells on which the ECS operation is performed. During an error check operation, the select address generation circuit 111 may store an address for accessing a memory cell in which the codeword CW that contains an error is stored. During a period in which the check flag signal CHK_FLAG is generated, the select address generation circuit 111 may output the stored address as the select row address SRADD and the select column command SCADD. The stored address may include a row address (RADD of FIG. 8) and a column address (CADD of FIG. 8).

The memory bank 131 may include memory cells, each of which is coupled to a word line and a bit line. One or more of word lines, coupled to the memory cells, included in the memory bank 131, may be selected by the select row address SRADD. One or more of bit lines, coupled to the memory cells, included in the memory bank 131, may be selected by the select column address SCADD. The memory cells, included in the memory bank 131, may be accessed through one or more word lines and one or more bit lines, which are selected. The numbers of the word lines and the bits lines, which are coupled to the memory cells that are included in the memory bank 131, may be set to various values in different embodiments. The codeword CW with data and parity may be stored in each of the memory cells that are included in the memory bank 131.

The sensing amplification circuit 133 may include a plurality of sense amplifiers (not illustrated). The sense amplifiers that are included in the sensing amplification circuit 133 may be coupled to the bit lines, coupled to the memory cells, included in the memory bank 131, and may sense and amplify data that is loaded on the bit lines.

The row control circuit 151 may select, as a row path, one or more of the word lines that are coupled to the memory cells that are included in the memory bank 131 and selected by the select row address SRADD. The row control circuit 151 may perform an ECS active operation that loads data and parities, stored in the memory cells of the row path that is selected by the select row address SRADD, onto bit lines such that the data and parities are sensed and amplified by the sensing amplification circuit 133.

The column control circuit 153 may control the input/output control circuit 155 such that data are input to/output from sense amplifiers that are selected by the select column command SCADD, among the sense amplifiers that are coupled to the memory cells of the row path. The column control circuit 153 may control the input/output control circuit 155 to perform the ECS read operation and the ECS write operation on the memory cells that are coupled to the sense amplifiers that are selected by the select column command SCADD, among the memory cells that are included in the memory bank 131 on which the ECS active operation has been performed.

The input/output control circuit 155 may control the data input/output between the sensing amplification circuit 133 and the error correction circuit 170 based on the ECS read command ERD and the ECS write command EWT. The input/output control circuit 155 may output the codeword CW, output from the memory bank 131, to the error correction circuit 170 during the ECC read operation. The input/output control circuit 155 may store the codeword CW, received from the error correction circuit 170, in the memory bank 131 during the ECC write operation. The codeword CW that is received from the error correction circuit 170 may include error-corrected data and parity.

The error correction circuit 170 may transmit/receive the codeword CW to/from the input/output control circuit 155 or transmit/receive Tx data TD to/from the data buffer 190 based on the ECS read command ERD and the ECS write command EWT. The error correction circuit 170 may generate the error flag signal EFLAG based on the codeword CW. The error correction circuit 170 may receive the codeword CW that is output through the input/output control circuit 155 when the ESC read operation is performed during the error check operation and may decode the codeword CW and generate the error flag signal EFLAG when an error is checked within the data and parity that are included in the decoded codeword CW. The error correction circuit 170 may generate the error-corrected codeword CW by performing an error correction operation when the ECS read operation is performed during the ECS operation. When the ECS write operation is performed, the error correction circuit 170 may transfer the error-corrected codeword CW to the input/output control circuit 155 to store the error-corrected codeword CW in the memory bank 131. The error correction circuit 170 may be configured to correct an error that is contained in the codeword CW by using the error correction code ECC.

The data buffer 190 may transmit/receive Tx data TD to/from the error correction circuit 170 or transmit/receive Tx data TD to/from a controller (not illustrated) based on the ECS read command ERD and the ECS write command EWT.

The semiconductor device 10, in accordance with the present embodiment, may perform the error check operation to sense memory cells in which the codewords CW that contain an error are stored and may perform the ECS operation only on the memory cells in which the codewords CW that contain an error are stored, thereby reducing the power consumption.

Figure 2:
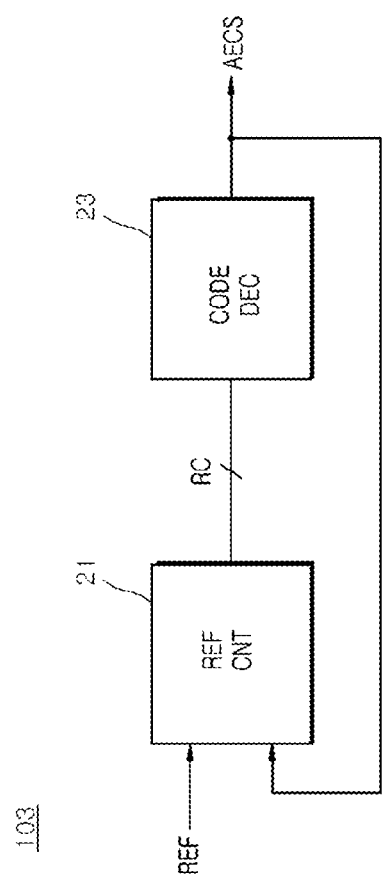
FIG. 2 is a block diagram illustrating a configuration based on an example of an ECS (Error Check and Scrub) command generation circuit included in the semiconductor device illustrated in FIG. 1.

FIG. 2 is a block diagram illustrating a configuration of the ECS command generation circuit 103 in accordance with an embodiment. As illustrated in FIG. 2, the ECS command generation circuit 103 may include a refresh counter 21 and a code decoder 23.

The refresh counter 21 may generate a refresh code RC by counting the refresh command REF. The refresh counter 21 may generate the refresh code RC that is initialized when the ECS command AECS is input. The refresh counter 21 may generate the refresh code RC that is counted whenever the refresh command REF is input. The refresh counter 21 may differently set the logic level combinations of bits that are contained in the refresh code RC whenever the refresh command REF is input. For example, when the refresh code RC is set to two bits, the logic level combination of the refresh code RC may be changed to '00', '01', '10', or '11', whenever the refresh command REF is input. The logic level combination '01' of the refresh code RC indicates that the second bit RC<2> of the refresh code has a logic low level, and the first bit RC<1> of the refresh code has a logic high level. The number of bits that are contained in the refresh code RC may be set to various values in different embodiments.

The code decoder 23 may generate the ECS command AECS based on the refresh code RC. The code decoder 23 may generate the ECS command AECS when the refresh code RC is counted as a preset logic level combination. The code decoder 23 may generate the ECS command AECS when the refresh code RC has the preset logic level combination. For example, the code decoder 23 may generate the ECS command AECS when the logic level combination of the refresh code RC<2:1>, which is set as the refresh command REF is generated for the third time, is '10'.

Figure 3:
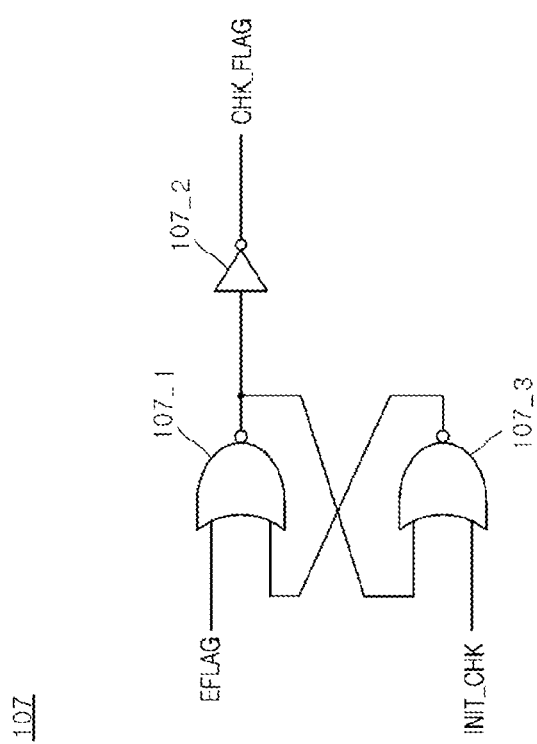
FIG. 3 is a circuit diagram illustrating a configuration based on an example of a check flag signal generation circuit included in the semiconductor device illustrated in FIG. 1.

FIG. 3 is a circuit diagram illustrating a configuration of the check flag signal generation circuit 107 in accordance with an embodiment. As illustrated in FIG. 3, the check flag signal generation circuit 107 may include a NOR gate 107_1, an inverter 107_2, and a NOR gate 107_3.

The check flag signal generation circuit 107 may generate the check flag signal CHK_FLAG based on the error flag signal EFLAG and the initialization check signal INIT_CHK. The check flag signal generation circuit 107 may generate the check flag signal CHK_FLAG that is enabled to a logic high level when the error flag signal EFLAG is input as a logic high level. The check flag signal generation circuit 107 may generate the check flag signal CHK_FLAG that is disabled to a logic low level when the initialization check signal INIT_CHK is input as a logic high level. The check flag signal generation circuit 107 may generate the check flag signal CHK_FLAG that is enabled to a logic high level until the initialization check signal INIT_CHK is input as a logic high level after the error flag signal EFLAG is input as a logic high level. The check flag signal generation circuit 107 may be implemented as an SR latch circuit.

Figure 4:
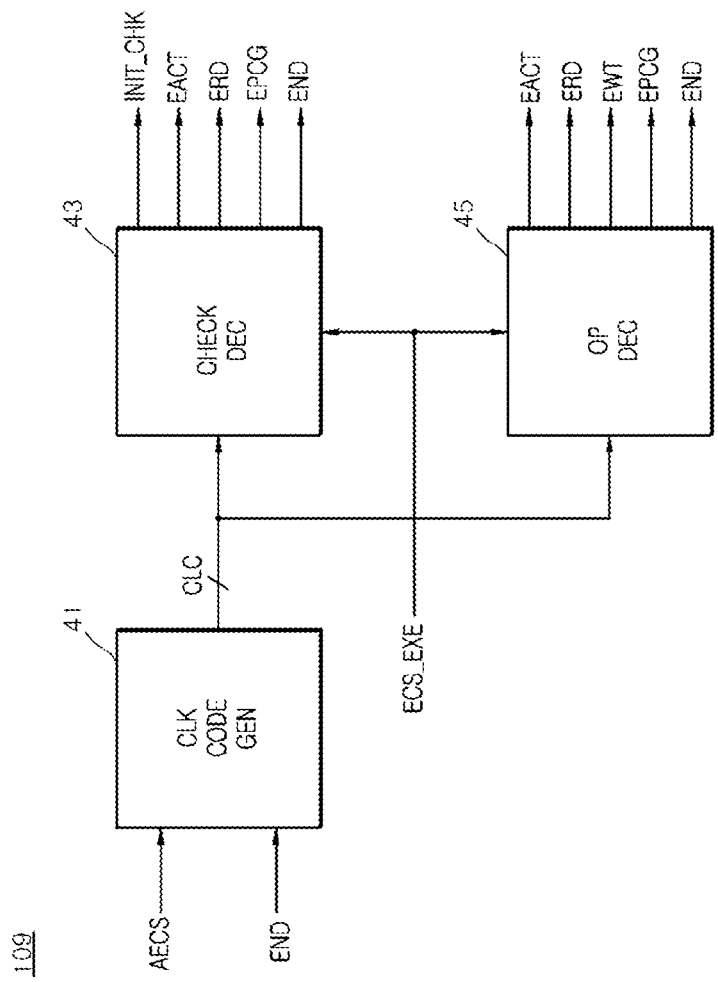
FIG. 4 is a block diagram illustrating a configuration based on an example of an ECS control circuit included in the semiconductor device illustrated in FIG. 1.

FIG. 4 is a block diagram illustrating a configuration of the ECS control circuit 109 in accordance with an embodiment. As illustrated in FIG. 4, the ECS control circuit 109 may include a clock code generation circuit 41, a check decoder 43, and an operation decoder 45.

The clock code generation circuit 41 may generate a clock code CLC based on the ECS command AECS and the end signal END. The clock code generation circuit 41 may generate the clock code CLC, the logic level combination of which is adjusted in synchronization with an oscillation signal (OSC of FIG. 5) that is generated during a time period from a point of time at which the ECS command AECS is generated to a point of time at which the end signal END is generated. The clock code generation circuit 41 may generate the clock code CLC that is counted whenever the oscillation signal (OSC of FIG. 5) is generated during the time period from the point of time at which the ECS command AECS is generated to the point of time at which the end signal END is generated.

The check decoder 43 may generate the initialization check signal INIT_CHK in order to disable the check flag signal CHK_FLAG. The check decoder 43 may generate the initialization check signal INIT_CHK to disable the check flag signal CHK_FLAG after the ECS active command EACT, the ECS read command ERD, the ECS write command EWT, and the ECS precharge command EPCG are repeatedly generated four times.

The check decoder 43 may generate the ECS active command EACT, the ECS read command ERD, the ECS precharge command EPCG, and the end signal END based on the error check execution signal ECS_EXE and the clock code CLC. The check decoder 43 may sequentially generate the ECS active command EACT, the ECS read command ERD, the ECS precharge command EPCG, and the end signal END in synchronization with the clock code CLC during a period in which the error check execution signal ECS_EXE is disabled. The check decoder 43 may sequentially generate the ECS active command EACT, the ECS read command ERD, the ECS precharge command EPCG, and the end signal END based on the clock code CLC during a period in which the error check execution signal ECS_EXE is disabled. During a period in which the error check execution signal ECS_EXE is disabled, the check decoder 43 may repeatedly generate the ECS read command ERD in order to determine whether each of the codewords CW contains an error. The number of times that the ECS read command ERD is repeatedly generated may be set to various values in different embodiments. The check decoder 43 may sequentially generate the ECS precharge command EPCG and the end signal END after repeatedly generating the ECS read command ERD. The logic level combinations of the clock code CLC for generating the ECS active command EACT, the ECS read command ERD, the ECS precharge command EPCG, and the end signal END may be set to values different from one another. For example, the ECS active command EACT may be generated when the clock code CLC is counted 10 times and generated, and the ECS read command ERD may be generated whenever the clock code CLC is counted 20 times, 24 times, 28 times and 30 times and generated.

The operation decoder 45 may generate the ECS active command EACT, the ECS read command ERD, the ECS write command EWT, the ECS precharge command EPCG, and the end signal END based on the error check execution signal ECS_EXE and the clock code CLC. During a period in which the error check execution signal ECS_EXE is enabled, the operation decoder 45 may sequentially generate the ECS active command EACT, the ECS read command ERD, the ECS write command EWT, the ECS precharge command EPCG, and the end signal END in synchronization with the clock code CLC. The operation decoder 45 may sequentially generate the ECS active command EACT, the ECS read command ERD, the ECS write command EWT, the ECS precharge command EPCG, and the end signal END in order to perform the ECS operation on the memory cells in which the codewords CW are stored. The logic level combinations of the clock code CLC for generating the ECS active command EACT, the ECS read command ERD, the ECS precharge command EPCG, and the end signal END may be set to values different from one another. For example, the ECS active command EACT may be generated when the clock code CLC is counted 10 times and generated, the ECS read command ERD may be generated when the clock code CLC is counted 20 times and generated, and the ECS write command EWT may be generated when the clock code CLC is counted 28 times and generated.

Figure 5:
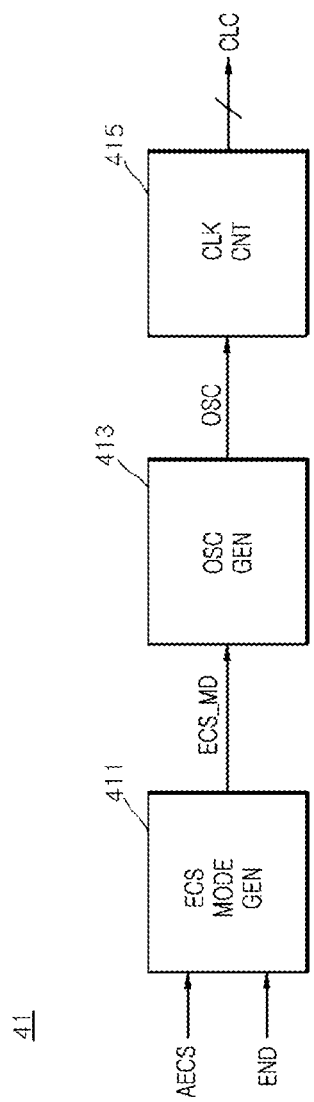
FIG. 5 is a block diagram illustrating a configuration based on an example of a clock code generation circuit included in the ECS control circuit illustrated in FIG. 4.

FIG. 5 is a block diagram illustrating a configuration of the clock code generation circuit 41 in accordance with an embodiment. As illustrated in FIG. 5, the clock code generation circuit 41 may include an ECS mode signal generation circuit 411, an oscillation signal generation circuit 413 and a clock counter 415.

The ECS mode signal generation circuit 411 may generate an ECS mode signal ECS_MD based on the ECS command AECS and the end signal END. The ECS mode signal generation circuit 411 may generate the ECS mode signal ECS_MD that is enabled from a point of time at which the ECS command AECS is generated to a point of time at which the end signal END is generated.

The oscillation signal generation circuit 413 may generate an oscillation signal OSC based on the ECS mode signal ECS_MD. The oscillation signal generation circuit 413 may generate the oscillation signal OSC that toggles in each preset period when the ECS mode signal ECS_MD is generated at a logic high level. The oscillation signal generation circuit 413 may generate the oscillation signal OSC that toggles during a period in which the ECS mode signal ECS_MD is generated at a logic high level.

The clock counter 415 may generate the clock code CLC based on the oscillation signal OSC. The clock counter 415 may generate the clock code CLC that is counted whenever the oscillation signal OSC is input. The clock counter 415 may adjust the logic level combination of the clock code CLC by counting the oscillation signal OSC. For example, when the clock code CLC contains three bits, the clock counter 415 may generate the clock code CLC that sequentially has logic level combinations of '001', '010', '011', '100', '101', '110', and '111' in synchronization with time points (hereafter, referred to as 'rising edges') that the oscillation signal OSC transitions from a logic low level to a logic high level. When the logic level combination of the clock code CLC is '110', it indicates that the third bit CLC<3> and the second bit CLC<2> of the clock code each have a logic high level, and the first bit CLC<1> of the clock code has a logic low level. The clock counter 415 may generate the clock code CLC that is initialized when no pulse of the oscillation signal OSC is input.

Figure 6:
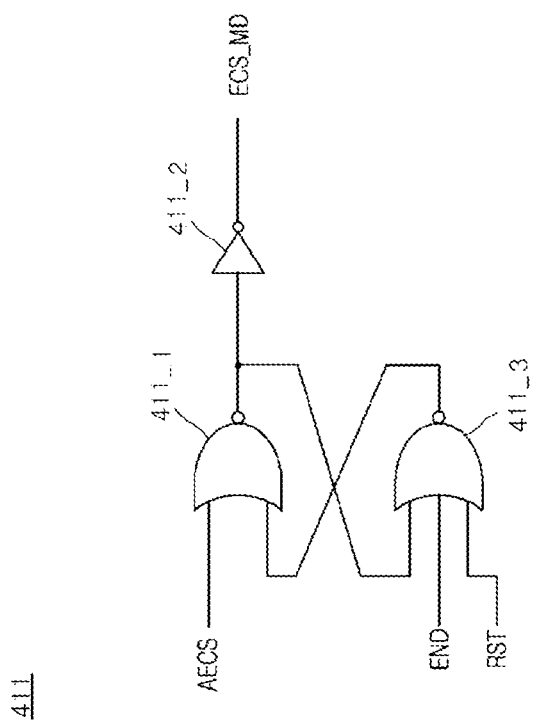
FIG. 6 is a circuit diagram illustrating a configuration based on an example of an ECS mode signal generation circuit included in the clock code generation circuit illustrated in FIG. 5.

FIG. 6 is a circuit diagram illustrating a configuration of the ECS mode signal generation circuit 411 in accordance with an embodiment. As illustrated in FIG. 6, the ECS mode signal generation circuit 411 may include a NOR gate 411_1, an inverter 411_2, and a NOR gate 411_3.

The ECS mode signal generation circuit 411 may generate the ECS mode signal ECS_MD based on the ECS command AECS, the end signal END, and a reset signal RST. The ECS mode signal generation circuit 411 may generate the ECS mode signal ECS_MD that is enabled to a logic high level when the ECS command AECS is input as a logic high level. The ECS mode signal generation circuit 411 may generate the ECS mode signal ECS_MD that is disabled to a logic low level when the end signal END is input as a logic high level. The ECS mode signal generation circuit 411 may generate the ECS mode signal ECS_MD that is disabled to a logic low level when the reset signal RST is input as a logic high level. The ECS mode signal generation circuit 411 may generate the ECS mode signal ECS_MD that is enabled to a logic high level until the end signal END is input as a logic high level after the ECS command AECS is input as a logic high level. The ECS mode signal generation circuit 411 may be implemented as an SR latch circuit. The reset signal RST may be set to a signal that is enabled to a logic high level during a reset operation of the semiconductor device 10.

Figure 7:
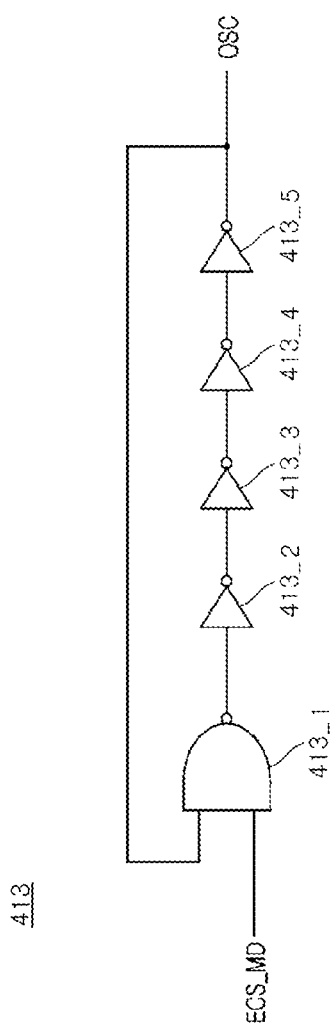
FIG. 7 is a circuit diagram illustrating a configuration based on an example of an oscillation signal generation circuit included in the clock code generation circuit illustrated in FIG. 5.

FIG. 7 is a circuit diagram illustrating a configuration of the oscillation signal generation circuit 413 in accordance with an embodiment. As illustrated in FIG. 7, the oscillation signal generation circuit 413 may include a NAND gate 413_1 and inverters 413_2 to 413_5.

The oscillation signal generation circuit 413 may generate the oscillation signal OSC that toggles in each preset period when the ECS mode signal ECS_MD is input as a logic high level. The NAND gate 413_1 that is included in the oscillation signal generation circuit 413 may operate as an inverter when the ECS mode signal ESC_MD is input as a logic high level. The oscillation signal generation circuit 413 may operate as a ring oscillator when the ECS mode signal ECS_MD is input as a logic high level and may generate the oscillation signal OSC that toggles in each preset period. During a period in which the ECS mode signal ECS_MD is generated at a logic high level, the oscillation signal generation circuit 413 may operate as a ring oscillator and generate the oscillation signal OSC that toggles.

Figure 8:
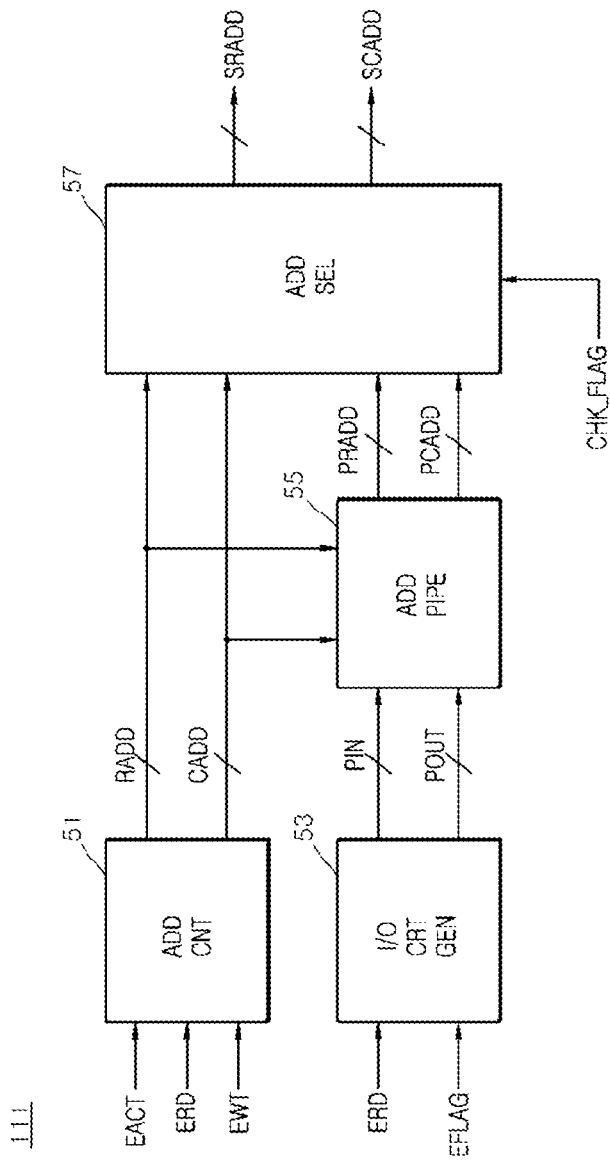
FIG. 8 is a block diagram illustrating a configuration based on an example of a select address generation circuit included in the semiconductor device illustrated in FIG. 1.

FIG. 8 is a block diagram illustrating a configuration of the select address generation circuit 111 in accordance with an embodiment. As illustrated in FIG. 8, the select address generation circuit 111 may include an address counter 51, an input/output control signal generation circuit 53, an address pipe 55, and an address selection circuit 57.

The address counter 51 may generate a row address RADD and a column address CADD based on the ECS active command EACT, the ECS read command ERD, and the ECS write command EWT. The address counter 51 may generate the row address RADD and the column address CADD that are sequentially counted whenever any one of the ECS read command ERD and the ECS write command EWT is input after the ECS active command EACT is input. The address counter 51 may generate the row address RADD and the column address CADD through which another memory cell can be accessed whenever any one of the ECS read command ERD and the ECS write command EWT is input after the ECS active command EACT is input.

The input/output control signal generation circuit 53 may generate an input control signal PIN based on the ECS read command ERD and the error flag signal EFLAG during an error check operation. For example, the input/output control signal generation circuit 53 may generate a first bit PIN<1> of the input control signal when the ESC read command ERD is generated and the error flag signal EFLAG is generated and may sequentially generate a second bit PIN<2>, a third bit PIN<3>, and a fourth bit PIN<4> of the input control signal whenever the error flag signal EFLAG is generated. The number of bits that are contained in the input control signal PIN may be set to various values in different embodiments.

The input/output control signal generation circuit 53 may generate an output control signal POUT based on the ECS read command ERD during an ECS operation. For example, the input/output control signal generation circuit 53 may generate a first bit POUT<1> of the output control signal when the ESC read command ERD is generated during the ECS operation and may sequentially generate a second bit POUT<2>, a third bit POUT<3>, and a fourth bit POUT<4> of the output control signal whenever the ESC read command ERD is generated. The number of bits that are contained in the output control signal POUT may be set to various values in different embodiments.

The address pipe 55 may store the row address RADD and the column address CADD based on the input control signal PIN and may output the row address RADD and the column address CADD, stored therein, as a pipe row address PRADD and a pipe column address PCADD based on the output control signal POUT. For example, the address pipe 55 may output the row address RADD and the column address CADD, stored when a $J^{th}$ bit PIN<J> of the input control signal is generated, as the pipe row address PRADD and the pipe column address PCADD when a $J^{th}$ bit POUT<J> of the output control signal is generated. Here, 'J' may be set to a natural number.

The address selection circuit 57 may generate the select row address SRADD and the select column address SCADD from the row address RADD, the column address CADD, the pipe row address PRADD, and the pipe column address PCADD based on the check flag signal CHK_FLAG. The address selection circuit 57 may select and output the row address RADD and the column address CADD as the select row address SRADD and the select column address SCADD during a period in which the check flag signal CHK_FLAG is disabled. The address selection circuit 57 may select and output the pipe row address RADD and the pipe column address CADD as the select row address SRADD and the select column address SCADD during a period in which the check flag signal CHK_FLAG is enabled.

Figure 9:
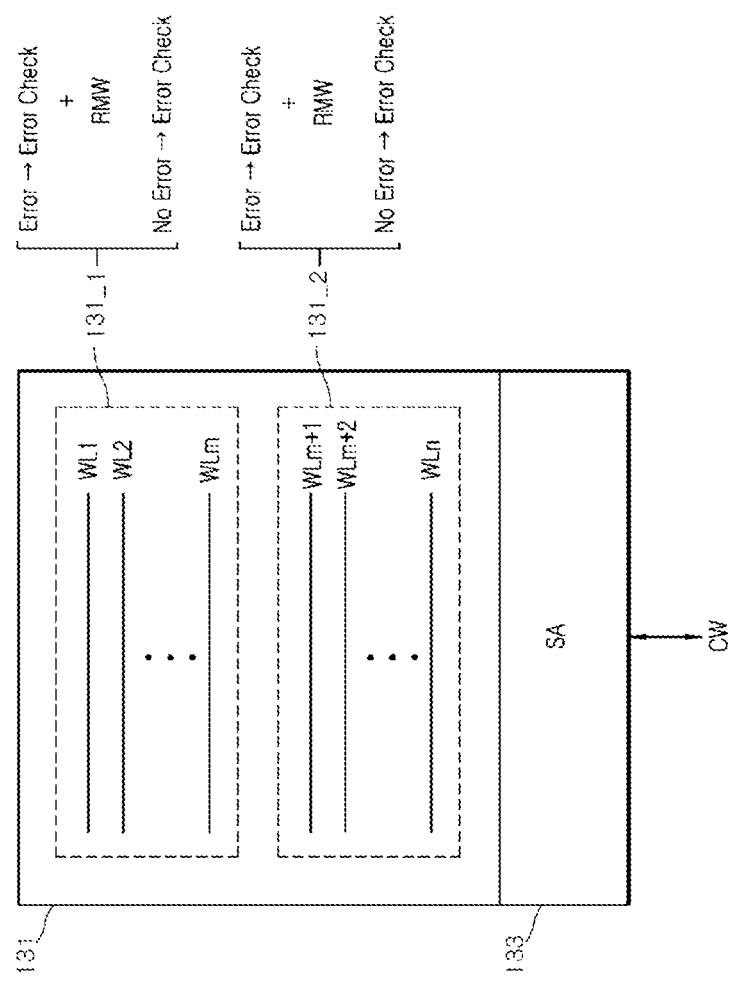
FIG. 9 is a block diagram illustrating configurations of a memory bank and a sensing amplification circuit, which are included in the semiconductor device illustrated in FIG. 1.

FIG. 9 is a block diagram illustrating configurations of the memory bank 131 and the sensing amplification circuit 133.

As illustrated in FIG. 9, the memory bank 131 may include a first area 131_1 and a second area 131_2.

The first area 131_1 may include first to $M^{th}$ word lines WL1 to WLm. The second area 131_2 may include $(M+1)^{th}$ to $N^{th}$ word lines WLm+1 to WLn. The number of the word lines that are included in the first and second areas 131_1 and 131_2 may be set to various values in different embodiments.

An error check operation Error Check on the first area 131_1 in a case Error in which an error occurs will be described with reference to FIG. 9.

The first area 131_1 may output a codeword CW that is stored in a memory cell (not illustrated) based on the ECS read command ERD that is repeatedly generated during the error check operation.

The sensing amplification circuit 133 may sense and amplify the codeword CW and may output the sensed and amplified codeword CW. At this time, because an error has occurred in the codeword CW, a read modify write operation RMW may be performed during the ECS operation. The read modify write operation RMW may indicate an operation of outputting the codeword CW when the ECS read command ERD is generated during the ECS operation and re-storing the error-corrected codeword CW at the same position when the ECS write command EWT is generated.

The error check operation on the first area 131_1 in the case of "No Error" in which no error occurs will be described with reference to FIG. 9.

The first area 131_1 may output a codeword CW that is stored in a memory cell (not illustrated) based on the ECS read command ERD that is repeatedly generated during the error check operation.

The sensing amplification circuit 133 may sense and amplify the codeword CW and may output the sensed and amplified codeword CW. At this time, because the codeword CW has no error, only the error check operation Error Check may be performed.

The error check operation Error Check on the second area 131_2 in the case of "Error" in which an error has occurred will be described with reference to FIG. 9.

The second area 131_2 may output a codeword CW that is stored in a memory cell (not illustrated) based on the ECS read command ERD that is repeatedly generated during an error check operation.

The sensing amplification circuit 133 may sense and amplify the codeword CW and may output the sensed and amplified codeword CW. At this time, because an error has occurred in the codeword CW, the read modify write operation RMW may be performed during the ECS operation. The read modify write operation RMW may indicate an operation of outputting the codeword CW when the ECS read command ERD is generated during the ECS operation and re-storing the error-corrected codeword CW at the same position when the ECS write command EWT is generated.

The error check operation on the second area 131_2 in the case No Error in which no error occurs will be described with reference to FIG. 9.

The second area 131_2 may output a codeword CW that is stored in a memory cell (not illustrated) based on the ECS read command ERD that is repeatedly generated during the error check operation.

The sensing amplification circuit 133 may sense and amplify the codeword CW and may output the sensed and amplified codeword CW. At this time, because the codeword CW has no error, only the error check operation Error Check may be performed.

The error check operation Error Check on the second area 131_2 may be performed after the error check operation Error Check on the first area 131_1 is completed.

Figure 10:
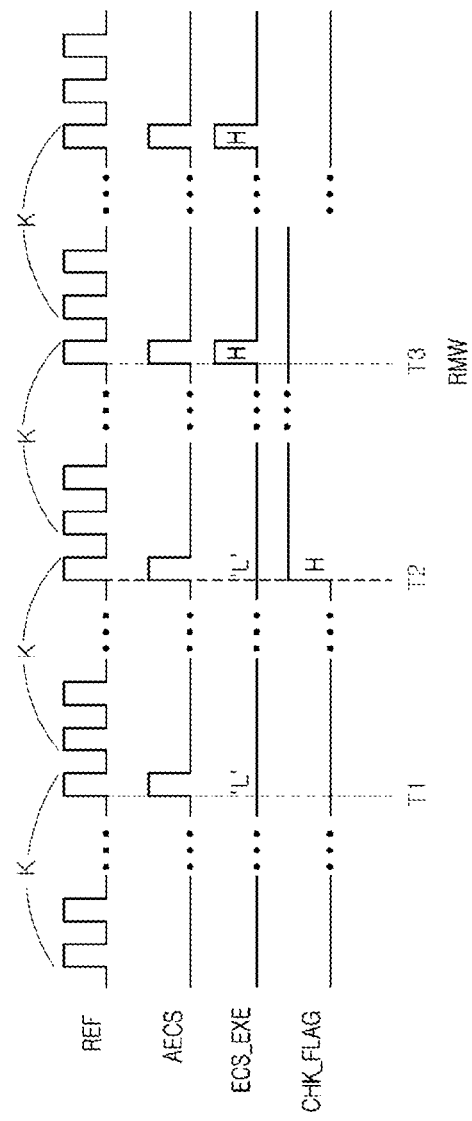
FIGS. 10 to 13 are timing diagrams for describing an error check operation and ECS operation of the semiconductor device in accordance with the present embodiment.

FIG. 10 is a timing diagram for describing an operation of the semiconductor device 10 illustrated in FIG. 1.

As illustrated in FIG. 10, the ECS command AECS may be generated whenever the refresh command REF is generated K times.

An operation at time T1 may be an operation that is performed when no error occurs in the codeword CW during the error check operation.

At time T1, the error check execution signal generation circuit 105 may generate the error check execution signal ECS_EXE that is disabled to a logic low level L during an initialization operation.

When no error occurs in the codeword CW, the check flag signal generation circuit 107 may receive the error flag signal EFLAG and generate the check flag signal CHK_FLAG that is disabled to a logic low level L.

The operation that is performed when no error occurs in the codeword CW during the error check operation will be described in more detail with reference to FIG. 11, which will be described below.

An operation at time T2 may be an operation that is performed when an error has occurred in the codeword CW during the error check operation.

At time T2, the error check execution signal generation circuit 105 may generate the error check execution signal ECS_EXE that is disabled to a logic low level L during the initialization operation.

The check flag signal generation circuit 107 may receive the error flag signal EFLAG that is generated when an error has occurred in the codeword CW and may generate the check flag signal CHK_FLAG that is enabled to a logic high level H.

The operation that is performed when an error has occurred in the codeword CW during the error check operation will be described in more detail with reference to FIG. 12, which will be described below.

An operation at time T3 may be an operation that is performed when an error has occurred in the codeword CW during the error check operation. In this case, the ECS operation may be performed.

At time T3, the error check execution signal generation circuit 105 may generate the error check execution signal ECS_EXE that is enabled to a logic high level H when the ECS command with a logic high level H and the check flag signal CHK_FLAG with a logic high level H are input.

The ECS control circuit 109 may sequentially generate the ECS active command EACT, the ECS read command ERD, the ECS write command EWT, the ECS precharge command EPCG, and the end signal END such that the ECS operation is performed on the memory cells in which each of the codewords CW that contains an error are stored. The operation of outputting the codeword CW to the error correction circuit 170 based on the ECS read command ERD and storing the error-corrected codeword CW based on the ECS write command EWT may be set to the read modify write operation RMW.

The operation of performing the ECS operation when an error occurs in the codeword CW during the error check operation will be described in more detail with reference to FIG. 13, which will be described below.

Figure 11:
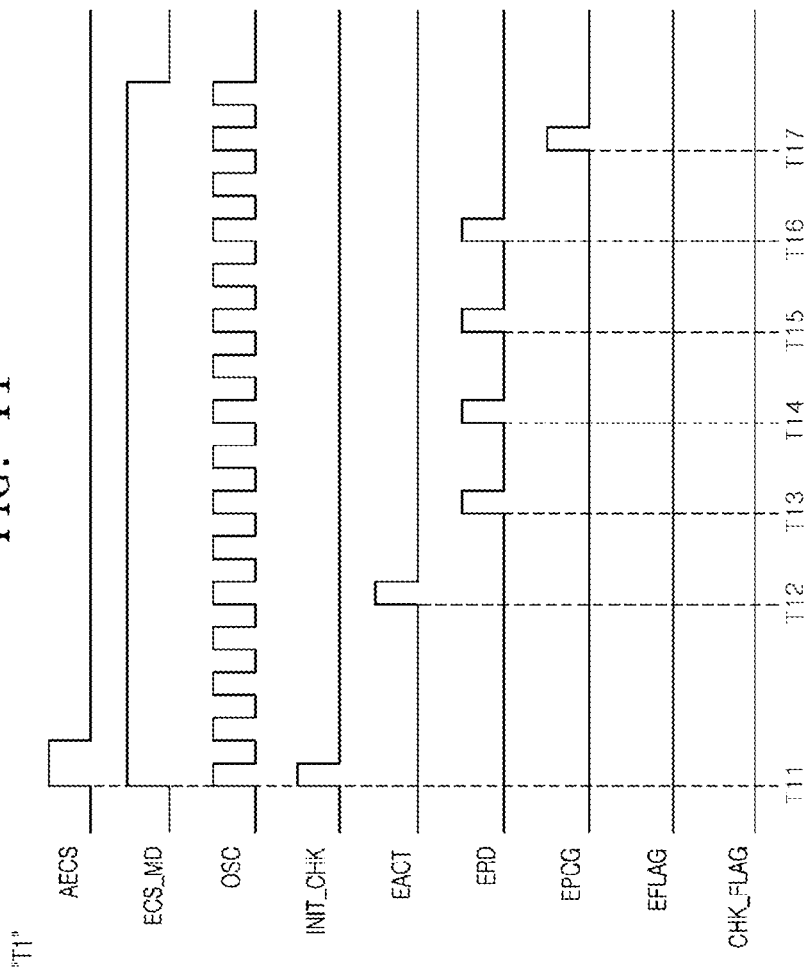

FIG. 11 is a timing diagram for describing an operation that is performed when no error occurs in the codeword CW during the error check operation. The error check operation illustrated in FIG. 11 indicates the operation at time T1 in FIG. 10.

At time T11, the ECS command generation circuit 103 may generate the ECS command AECS when the refresh command REF is generated a preset number of times or K times.

The error check execution signal generation circuit 105 may generate the error check execution signal ECS_EXE that is disabled to a logic low level during the initialization operation.

The ECS mode signal generation circuit 411 of the clock code generation circuit 41 may generate the ECS mode signal ECS_MD that is enabled to a logic high level at a point of time at which the ECS command AECS is generated.

The oscillation signal generation circuit 413 of the clock code generation circuit 41 may generate the oscillation signal OSC that toggles in each preset period when the ECS mode signal ECS_MD is generated at a logic high level.

The ECS control circuit 109 may generate the initialization check signal INIT_CHK in order to disable the check flag signal CHK_FLAG during a period in which the error check execution signal ECS_EXE is disabled.

At time T12, the ECS control circuit 109 may generate the ECS active command EACT in order to determine whether each of the codewords CW that is stored in the memory cells on which the ECS operation is performed contains an error during the period in which the error check execution signal ECS_EXE is disabled.

From time T13 to time T16, the ECS control circuit 109 may repeatedly generate the ECS read command ERD in order to output the codewords CW that are stored in the memory cells. The ECS control circuit 109 may be implemented to generate the ECS read command ERD four times. In an embodiment, however, the ECS control circuit 109 may generate the ECS read command ERD various numbers of times.

From time T13 to time T16, when the data and parity that are included in the decoded codeword CW contain no error, the error correction circuit 170 may receive the codeword CW that is output through the input/output control circuit 155 when the ESC read operation is performed during the error check operation and may decode the codeword CW and generate the error flag signal EFLAG that is disabled to a logic low level.

The check flag signal generation circuit 107 may receive the low-level error flag signal EFLAG that is generated when no error occurs in the codeword CW and may generate the check flag signal CHK_FLAG that is disabled to a logic low level.

At time T17, the ECS control circuit 109 may generate the ECS precharge command EPCG in order to perform a precharge operation on the memory cells on which the error check operation has been performed during a period in which the error check execution signal ECS_EXE is disabled.

Figure 12:
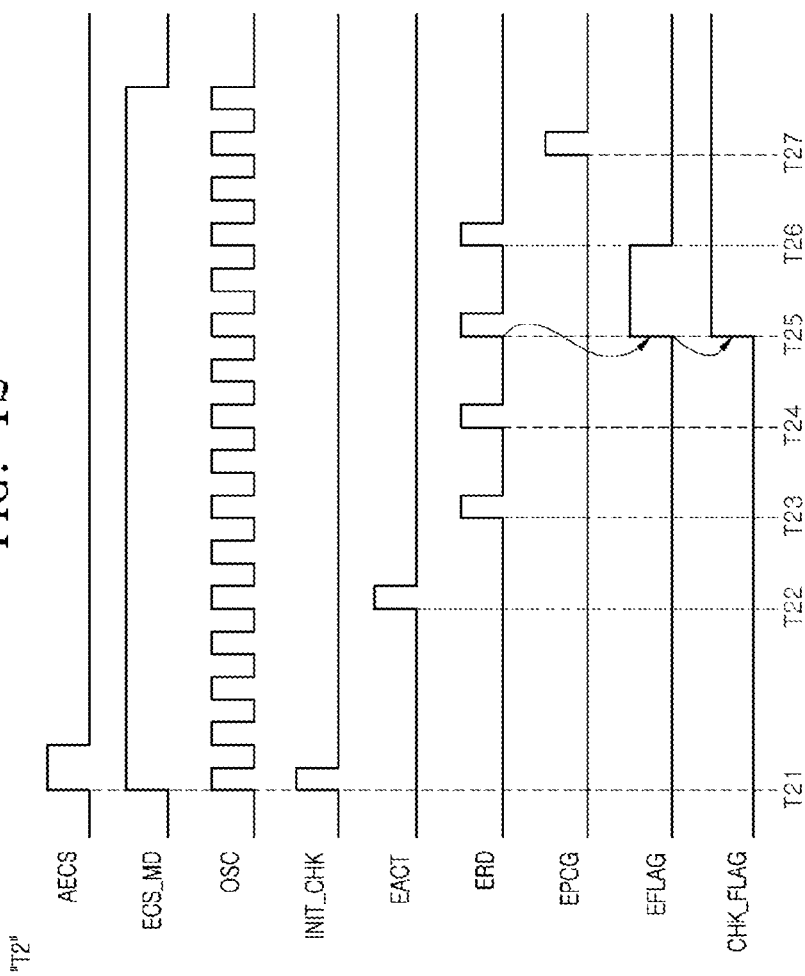

FIG. 12 is a timing diagram for describing an operation that is performed when an error occurs in the codeword CW during the error check operation. The error check operation, illustrated in FIG. 12, indicates the operation at time T2 in FIG. 10.

At time T21, the ECS command generation circuit 103 may generate the ECS command AECS when the refresh command REF is generated a preset number of times or K times.

The error check execution signal generation circuit 105 may generate the error check execution signal ECS_EXE that is disabled to a logic low level during the initialization operation.

The ECS mode signal generation circuit 411 of the clock code generation circuit 41 may generate the ECS mode signal ECS_MD that is enabled to a logic high level at a point of time at which the ECS command AECS is generated.

The oscillation signal generation circuit 413 of the clock code generation circuit 41 may generate the oscillation signal OSC that toggles in each preset period when the ECS mode signal ECS_MD is generated at a logic high level.

The ECS control circuit 109 may generate the initialization check signal INIT_CHK in order to disable the check flag signal CHK_FLAG during a period in which the error check execution signal ECS_EXE is disabled.

At time T22, during the period in which the error check execution signal ECS_EXE is disabled, the ECS control circuit 109 may generate the ECS active command EACT in order to determine whether each of the codewords CW that is stored in the memory cells on which the ECS operation is performed contains an error.

From time T23 to time T26, the ECS control circuit 109 may repeatedly generate the ECS read command ERD in order to output the codewords CW that are stored in the memory cells. The ECS control circuit 109 may be implemented to generate the ECS read command ERD four times. In an embodiment, however, the ECS control circuit 109 may generate the ECS read command ERD various numbers of times.

At time T25, the error correction circuit 170 may receive the codeword CW output through the input/output control circuit 155 when the ESC read operation is performed during the error check operation and may decode the codeword CW and generate the error flag signal EFLAG that is enabled to a logic high level, when an error is checked from the data and parity that are included in the decoded codeword CW.

The select address generation circuit 111 may receive the high-level error flag signal EFLAG and store an address for accessing a memory cell in which a codeword is stored, the codeword containing an error that occurred during the error check operation.

The check flag signal generation circuit 107 may receive the high-level error flag signal EFLAG that is generated when an error occurs in the codeword CW and may generate the check flag signal CHK_FLAG that is disabled to a logic high level.

At time T27, the ECS control circuit 109 may generate the ECS precharge command EPCG in order to perform a precharge operation on the memory cells on which the error check operation has been performed during a period in which the error check execution signal ECS_EXE was disabled.

Figure 13:
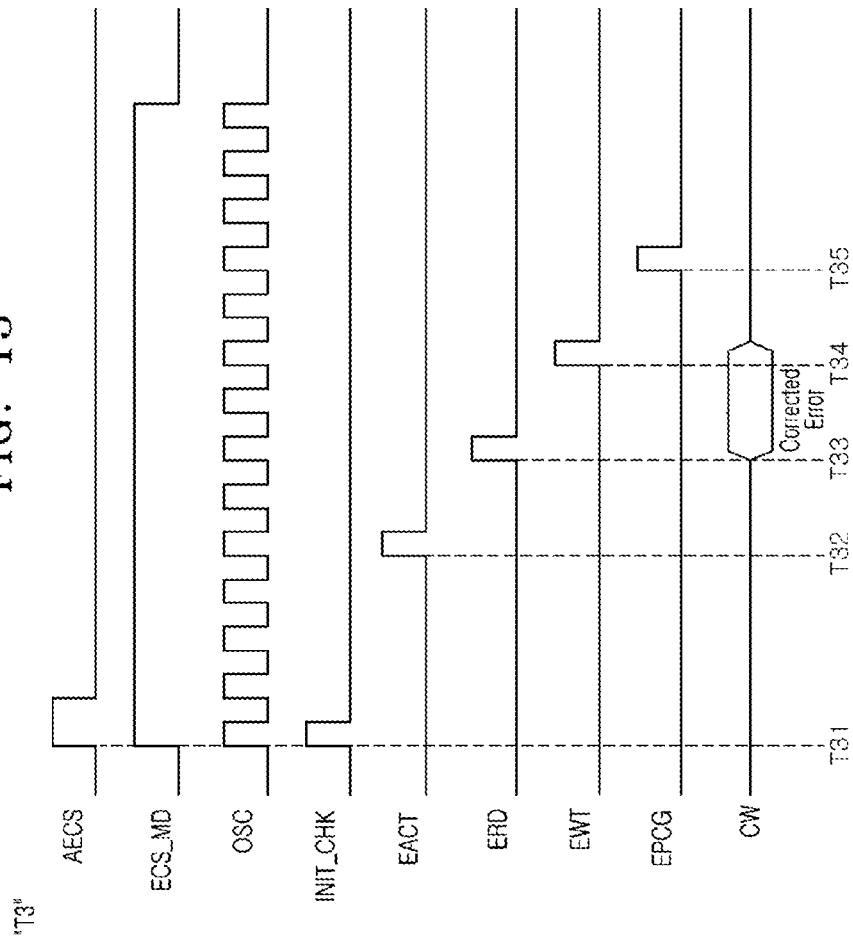

FIG. 13 is a timing diagram for describing the operation that is performed when the ECS operation is performed as an error occurs in the codeword CW during the error check operation. The error check operation illustrated in FIG. 13 indicates the operation at time T3 in FIG. 10.

At time T31, the ECS command generation circuit 103 may generate the ECS command AECS when the refresh command REF is generated a preset number of times or K times.

The error check execution signal generation circuit 105 may receive the high-level ECS command AECS and the high-level check flag signal CHK_FLAG and may generate the error check execution signal ECS_EXE that is enabled to a logic high level.

The ECS mode signal generation circuit 411 of the clock code generation circuit 41 may generate the ECS mode signal ECS_MD that is enabled to a logic high level at a point of time at which the ECS command AECS is generated.

The oscillation signal generation circuit 413 of the clock code generation circuit 41 may generate the oscillation signal OSC that toggles in each preset period when the ECS mode signal ECS_MD is generated at a logic high level.

At time T32, the ECS control circuit 109 may generate the ECS active command EACT in order to determine whether each of the codewords CW that is stored in the memory cells, on which the ECS operation is performed during a period in which the error check execution signal ECS_EXE is enabled, contains an error.

At time T33, the ECS control circuit 109 may generate the ECS read command ERD in order to output the codewords CW that are stored in the memory cells on which the ECS operation is performed.

During the error check operation, the select address generation circuit 111 may receive the high-level check flag signal CHK_FLAG and output an address that is stored therein as the select row address SRADD and the select column command SCADD in order to access a memory cell in which the codeword CW that contains an error is stored.

The memory bank 131 may output the codeword CW, stored in a memory cell that is selected by the select row address SRADD and the select column command SCADD, to the error correction circuit 170 through the input/output control circuit 155.

The error correction circuit 170 may receive the codeword CW and generate the error-corrected codeword CW by performing the error correction operation.

At time T34, the ECS control circuit 109 may generate the ECS write command EWT in order to store the codeword CW in the memory cells on which the ECS operation is performed.

During the error check operation, the select address generation circuit 111 may receive the high-level check flag signal CHK_FLAG and output an address that is stored therein as the select row address SRADD and the select column command SCADD in order to access a memory cell in which the codeword CW that contains an error is stored.

The error correction circuit 170 may transfer the error-corrected codeword CW to the input/output control circuit 155 to store the error-corrected codeword CW in the memory bank 131.

At time T35, the ECS control circuit 109 may generate the ECS precharge command EPCG in order to perform a precharge operation on the memory cells on which the ECS operation has been performed during a period in which the error check execution signal ECS_EXE was enabled.

The semiconductor device 10, in accordance with the present embodiment, may perform the ECS operation of performing an error check operation of detecting errors of the codewords that are stored in memory cells, correcting the errors of the codewords, and re-storing the codewords. Thus, the semiconductor device 10 may perform the ECS operation that is capable of correcting the errors of the codewords that are stored in the memory cells, and re-storing the error-corrected codewords in the memory cells. Furthermore, the semiconductor device 10, in accordance with the present embodiment, may perform the error check operation of detecting errors of the codewords that are stored in the memory cells and then perform the ECS operation only on an area in which the codeword that contains an error is stored, thereby reducing power consumption.

Figure 14:
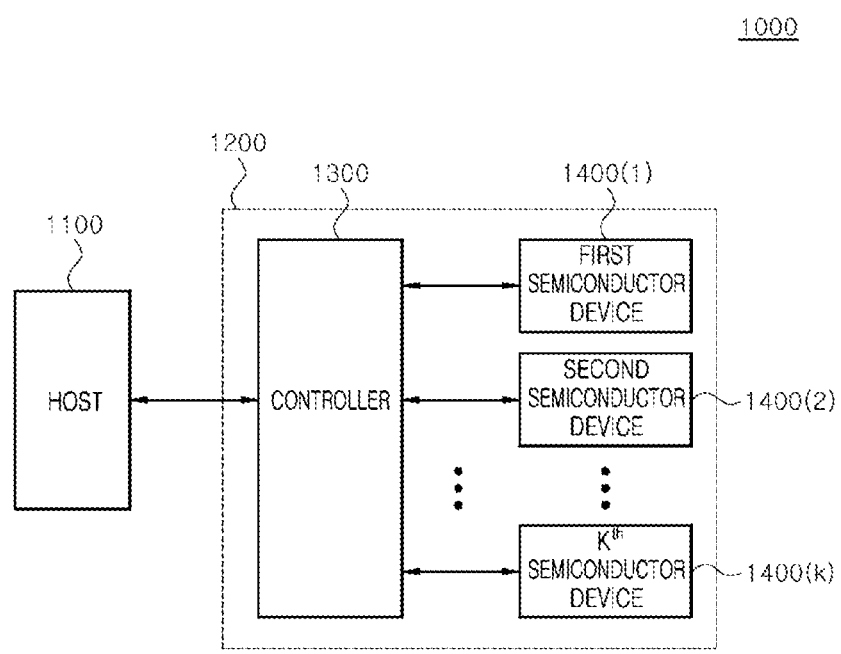
FIG. 14 is a diagram illustrating a configuration of an electronic system in accordance with an embodiment to which the semiconductor device illustrated in FIGS. 1 to 13 is applied.

FIG. 14 is a block diagram illustrating a configuration of an electronic system 1000 in accordance with an embodiment. As illustrated in FIG. 14, the electronic system 1000 may include a host 1100 and a semiconductor system 1200.

The host 1100 and the semiconductor system 1200 may transmit/receive signals to/from each other by using an interface protocol. Examples of the interface protocol used between the host 1100 and the semiconductor system 1200 may include an MMC (Multi-Media Card), ESDI (Enhanced Small Disk Interface), IDE (Integrated Drive Electronics), PCI-E (Peripheral Component Interconnect-Express), ATA (Advanced Technology Attachment), SATA (Serial ATA), PATA (Parallel ATA), SAS (serial attached SCSI), USB (Universal Serial Bus) and the like.

The semiconductor system 1200 may include a controller 1300 and semiconductor devices 1400(K:1). The controller 1300 may control the semiconductor devices 1400(K:1) to perform an error check operation and an ECS operation based on a refresh command REF. Each of the semiconductor devices 1400(K:1) may perform the error check operation and the ECS operation based on the refresh command REF, and thus, perform the ECS operation only on the memory cells in which the codewords CW that contains an error is stored.

Each of the semiconductor devices 1400(K:1) may be implemented as the semiconductor device 10 illustrated in FIG. 1. In an embodiment, each of the semiconductor devices 1400(K:1) may be implemented as one of a DRAM (dynamic random access memory), PRAM (Phase change Random Access Memory), RRAM (Resistive Random Access Memory), MRAM (Magnetic Random Access Memory) and FRAM (Ferroelectric Random Access Memory).

Although some embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A semiconductor device comprising:
an error check execution signal generation circuit configured to generate an error check execution signal for performing an error check operation when an ECS (Error Check and Scrub) command that is generated based on a refresh command is input; and
an ECS control circuit configured to:
generate an ECS active command and an ECS read command for performing the error check operation based on the ECS command and the error check execution signal, and
successively generate the ECS read commands to perform the error check operation.

2. The semiconductor device of claim 1, wherein, during the error check operation, the error check execution signal generation circuit is configured to generate the error check execution signal that is disabled based on a check flag signal that is generated when a codeword contains an error.

3. The semiconductor device of claim 1, wherein the error check operation is an operation that successively outputs the codewords that are stored in a memory bank and detects whether each of the codewords contains an error.

4. The semiconductor device of claim 1, wherein the codewords comprise a first code word and a second code word, and
wherein the ECS control circuit is configured to perform the error check operation on the second codeword that is stored in a second area that is included in a memory bank after performing the error check operation on the first codeword that is stored in a first area that is included in the memory bank.

5. The semiconductor device of claim 1, wherein the ECS control circuit is configured to generate the ECS active command for performing the ECS operation, the ECS read command, an ECS write command, an ECS precharge signal, and an end signal based on the ECS command and the error check execution signal.

6. The semiconductor device of claim 1, wherein, when the ECS command is input during a period in which the error check execution signal is disabled, the ECS control circuit is configured to generate the ECS active command and then to successively generate the ECS read commands, and configured to generate an ECS precharge signal and an end signal, and
wherein, when the ECS command is input during a period in which the error check execution signal is enabled, the ECS control circuit is configured to sequentially generate the ECS active command, the ECS read command, an ECS write command, the ECS precharge signal, and the end signal.

7. The semiconductor device of claim 6, wherein the ECS control circuit comprises:
a clock code generation circuit configured to:
generate a clock code signal that is counted whenever the ECS command is input, and
generate the clock code signal that is initialized when the end signal is input;
a check decoder configured to generate the ECS active command, the ECS read command, the ECS precharge signal, and the end signal based on a logic level combination of the clock code signal during a period in which the error check execution signal is disabled; and
an operation decoder configured to generate the ECS active command, the ECS read command, the ECS write command, the ECS precharge signal, and the end signal based on the logic level combination of the clock code signal during a period in which the error check execution signal is enabled.

8. The semiconductor device of claim 7, wherein the clock code generation circuit comprises:
an ECS mode signal generation circuit configured to generate an ECS mode signal that is enabled from a point of time at which the ECS command is input to a point of time at which the end signal is input;
an oscillation signal generation circuit configured to generate an oscillation signal that toggles during a period in which the ECS mode signal is enabled; and
a clock counter configured to:
generate the clock code that is counted whenever a pulse of the oscillation signal is input, and
initialize the clock code when a pulse of the oscillation signal is not input.

9. The semiconductor device of claim 1, further comprising an ECS command generation circuit configured to generate the ECS command that is generated whenever the refresh command is input a preset number of times.

10. The semiconductor device of claim 9, wherein the ECS command generation circuit comprises:

a refresh counter configured to:
generate a refresh counting code that is counted whenever the refresh command is input, and
generate the refresh counting code that is initialized when the ECS command is input; and
a code decoder configured to generate the ECS command that is generated when the refresh counting code is counted a preset number of times.

11. A semiconductor device comprising:
an ECS control circuit configured to:
generate an ECS active command for performing an error check operation based on an ECS command and an error check execution signal, and
then successively generate ECS read commands; and
a select address generation circuit configured to:
output, as a select row address and a select column address, during the error check operation, a row address and a column address that are sequentially counted whenever the ECS active command and the ECS read command are input, and
store the counted row address and column address when an error flag signal is input.

12. The semiconductor device of claim 11, wherein the error check operation is an operation that successively outputs codewords that are stored in a memory bank and detects whether each of the codewords contains an error.

13. The semiconductor device of claim 11, wherein the ECS control circuit is configured to generate the ECS active command for performing the ECS operation, the ECS read command, an ECS write command, an ECS precharge signal, and an end signal based on the ECS command and the error check execution signal.

14. The semiconductor device of claim 11, wherein the select address generation circuit is configured to:
output, as the select row address and the select column address, the row address and the column address that are sequentially counted when the check flag signal is disabled, and
output the stored row address and column address as the select row address and the select column address when the check flag signal is enabled.

15. The semiconductor device of claim 11, wherein the ECS control circuit is configured to:
generate the ECS active command and then successively generate the ECS read commands when the ECS command is input during a period in which the error check execution signal is disabled, and
generate an ECS precharge signal and an end signal, and sequentially generate the ECS active command, the ECS read command, the ECS write command, the ECS precharge signal, and the end signal when the ECS command is input during a period in which the error check execution signal is enabled.

16. The semiconductor device of claim 15, wherein the ECS control circuit comprises:
a clock code generation circuit configured to:
generate a clock code signal that is counted whenever the ECS command is input, and
generate the clock code signal that is initialized when the end signal is input;
a check decoder configured to generate the ECS active command, the ECS read command, the ECS precharge signal, and the end signal based on a logic level combination of the clock code signal during a period in which the error check execution signal is disabled; and
an operation decoder configured to generate the ECS active command, the ECS read command, the ECS write command, the ECS precharge signal, and the end signal based on the logic level combination of the clock code signal during a period in which the error check execution signal is enabled.

17. The semiconductor device of claim 16, wherein the clock code generation circuit comprises:
an ECS mode signal generation circuit configured to generate an ECS mode signal that is enabled from a point of time at which the ECS command is input to a point of time at which the end signal is input;
an oscillation signal generation circuit configured to generate an oscillation signal that toggles during a period in which the ECS mode signal is enabled; and
a clock counter configured to:
generate the clock code that is counted whenever a pulse of the oscillation signal is input, and
initialize the clock code when a pulse of the oscillation signal is not input.

18. The semiconductor device of claim 11, wherein the select address generation circuit comprises:
an address counter configured to generate the row address and the column address that are sequentially counted whenever the ECS active command, the ECS read command, and the ECS write command are input;
an input/output control signal generation circuit configured to generate an input control signal and an output control signal based on the ECS read command during a period in which an error flag signal is enabled;
an address pipe configured to:
store the row address and the column address when the input control signal is input, and
output the stored row address and column address as a pipe row address and pipe column address when the output control signal is input; and
an address selection circuit configured to:
output the row address and the column address as the select row address and the select column address based on the logic level of the check flag signal, or
output the pipe row address and the pipe column address as the select row address and the select column address.

19. The semiconductor device of claim 11, further comprising a memory bank configured to:
output codewords that are stored in a plurality of word lines that are selectively activated by the select row address and the select column address, or
store the codewords.

20. The semiconductor device of claim 19, wherein the codewords comprise a first codeword and a second codeword,
wherein the memory bank comprises:
a first area configured to:
output the first codeword that is stored in a first word line that is selectively activated by the select row address and the select column address, or
store the first codeword; and
a second area configured to:
output the second codeword that is stored in a second word line that is selectively activated by the select row address and the select column address, or
store the second codeword.

* * * * *